(12) United States Patent
Rice

(10) Patent No.: US 12,019,104 B2
(45) Date of Patent: Jun. 25, 2024

(54) POWER MONITORING AND SIGNAL UNIT

(71) Applicant: IMPRENDITORE PTY LIMITED, Armidale (AU)

(72) Inventor: Patrick Jeremy Rice, Armidale (AU)

(73) Assignee: Imprenditore Pty Limited, Armidale (AU)

(*) Notice: Subject to any disclaimer, the term of this patent is extended or adjusted under 35 U.S.C. 154(b) by 0 days.

(21) Appl. No.: 15/675,742

(22) Filed: Aug. 13, 2017

(65) Prior Publication Data

US 2018/0003748 A1  Jan. 4, 2018

Related U.S. Application Data

(63) Continuation of application No. 15/215,616, filed on Jul. 21, 2016, now abandoned, which is a (Continued)

(30) Foreign Application Priority Data

Sep. 21, 2011 (AU) .................................. 2011226785

(51) Int. Cl.
*G01R 21/133* (2006.01)
*G01D 4/00* (2006.01)
(Continued)

(52) U.S. Cl.
CPC ............ *G01R 21/133* (2013.01); *G01D 4/002* (2013.01); *G08C 17/02* (2013.01); *H04Q 9/00* (2013.01);
(Continued)

(58) Field of Classification Search
CPC ..... G01D 4/002; G01R 21/133; G01R 22/063; G08C 17/02; G08C 2201/93;
(Continued)

(56) References Cited

U.S. PATENT DOCUMENTS 4,977,515 A   12/1990  Rudden et al.
D325,370 S *  4/1992  Belcher .................... D13/137.3
(Continued)

FOREIGN PATENT DOCUMENTS

DE       202009008623       12/2009
WO    WO-2008134810 A1 * 11/2008 .............. H04W 4/70

*Primary Examiner* — Quan Zhen Wang
*Assistant Examiner* — Rajsheed O Black-Childress
(74) *Attorney, Agent, or Firm* — Burdick Patents, P.A.; Sean D. Burdick

(57) ABSTRACT

A power monitoring and signal unit provided with projecting connectors at a first face and sockets for receiving like connectors in a second opposite face, and circuitry for monitoring power flow through said unit when projecting connectors are plugged into a mains power outlet; said unit further provided with transceiver circuitry for the transmission and reception of data including command and control data. The power monitoring and signal unit may be in communication with a programmable sensor device comprising an individual signal unit registered by an owner of individual signal unit with a central control facility; The individual signal unit communicates with central control facility when an even sensor activates said individual signal unit; central control facility executing a user-assembled schedule of predefined steps on receipt of a communication from individual signal unit, predefined steps configured or reconfigurable by an owner of said individual signal unit from a web site.

10 Claims, 12 Drawing Sheets

Related U.S. Application Data continuation of application No. 14/346,727, filed as application No. PCT/AU2012/001150 on Sep. 21, 2012, now abandoned.

(51) Int. Cl.
| | |
|---|---|
| *G01R 22/06* | (2006.01) |
| *G08C 17/02* | (2006.01) |
| *H04Q 9/00* | (2006.01) |
| *H04W 4/80* | (2018.01) |
| *H04W 84/12* | (2009.01) |
| *H04W 88/02* | (2009.01) |

(52) U.S. Cl.
CPC ............ *H04W 4/80* (2018.02); *G01R 22/063* (2013.01); *G08C 2201/93* (2013.01); *H04Q 2209/43* (2013.01); *H04W 84/12* (2013.01); *H04W 88/02* (2013.01); *Y02E 60/00* (2013.01); *Y04S 10/30* (2013.01)

(58) Field of Classification Search
CPC ..... H04Q 2209/43; H04Q 9/00; H04W 4/008; H04W 84/12; H04W 88/02; Y02E 60/74; Y04S 10/30
See application file for complete search history.

(56) References Cited

U.S. PATENT DOCUMENTS

| | | | |
|---|---|---|---|
| 6,906,617 B1* | 6/2005 | Van der Meulen | G01R 19/2513 340/12.39 |
| 7,964,989 B1* | 6/2011 | Puschnigg | G06F 1/266 307/116 |
| 7,983,685 B2* | 7/2011 | Silverstrim | H04W 12/04 455/449 |
| 2003/0050737 A1* | 3/2003 | Osann, Jr. | G05B 15/02 700/276 |
| 2009/0079416 A1* | 3/2009 | Vinden | G01R 22/06 324/103 R |
| 2009/0167494 A1* | 7/2009 | Martins | G01R 21/133 340/10.1 |
| 2009/0174569 A1* | 7/2009 | Smith | H04B 3/542 340/8.1 |
| 2009/0251127 A1* | 10/2009 | Kim | G01R 22/063 324/76.11 |
| 2009/0295232 A1* | 12/2009 | McGinley | G06F 1/26 307/126 |

* cited by examiner

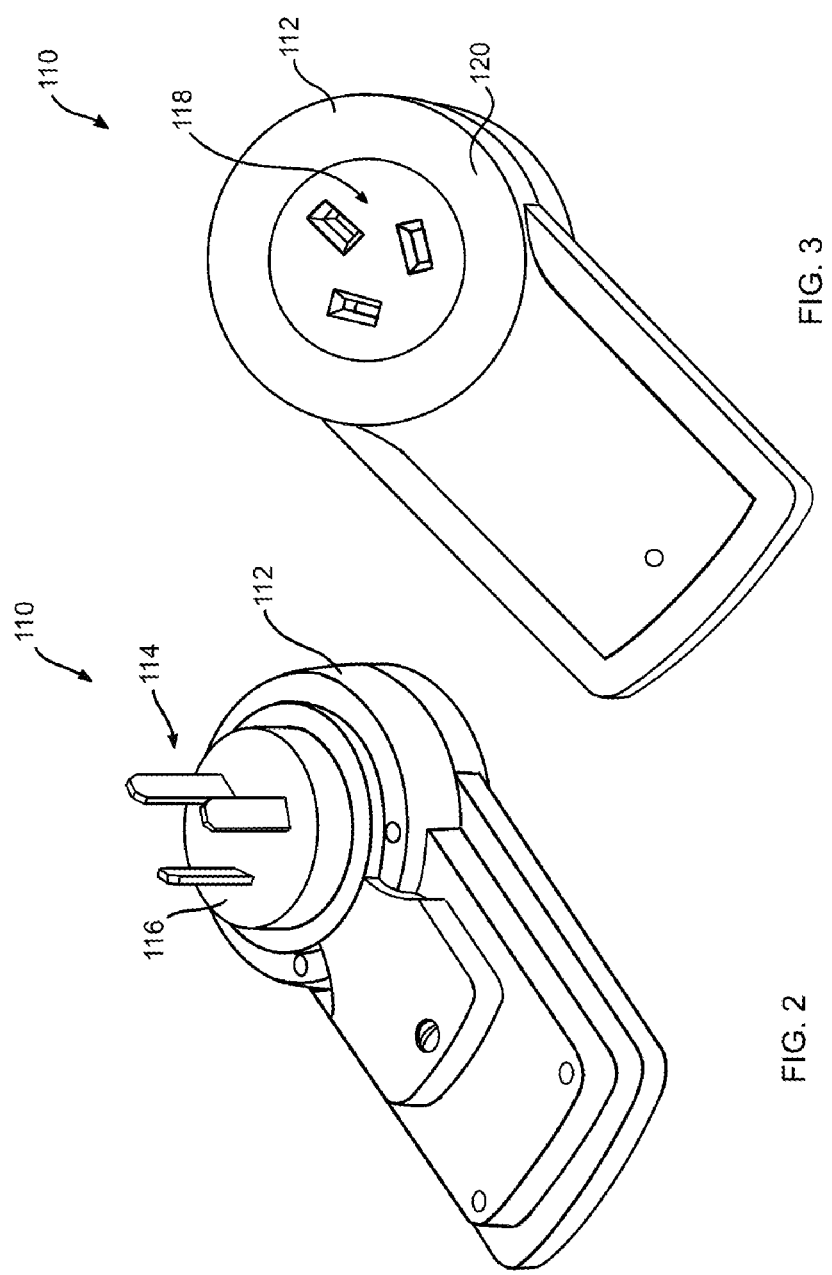

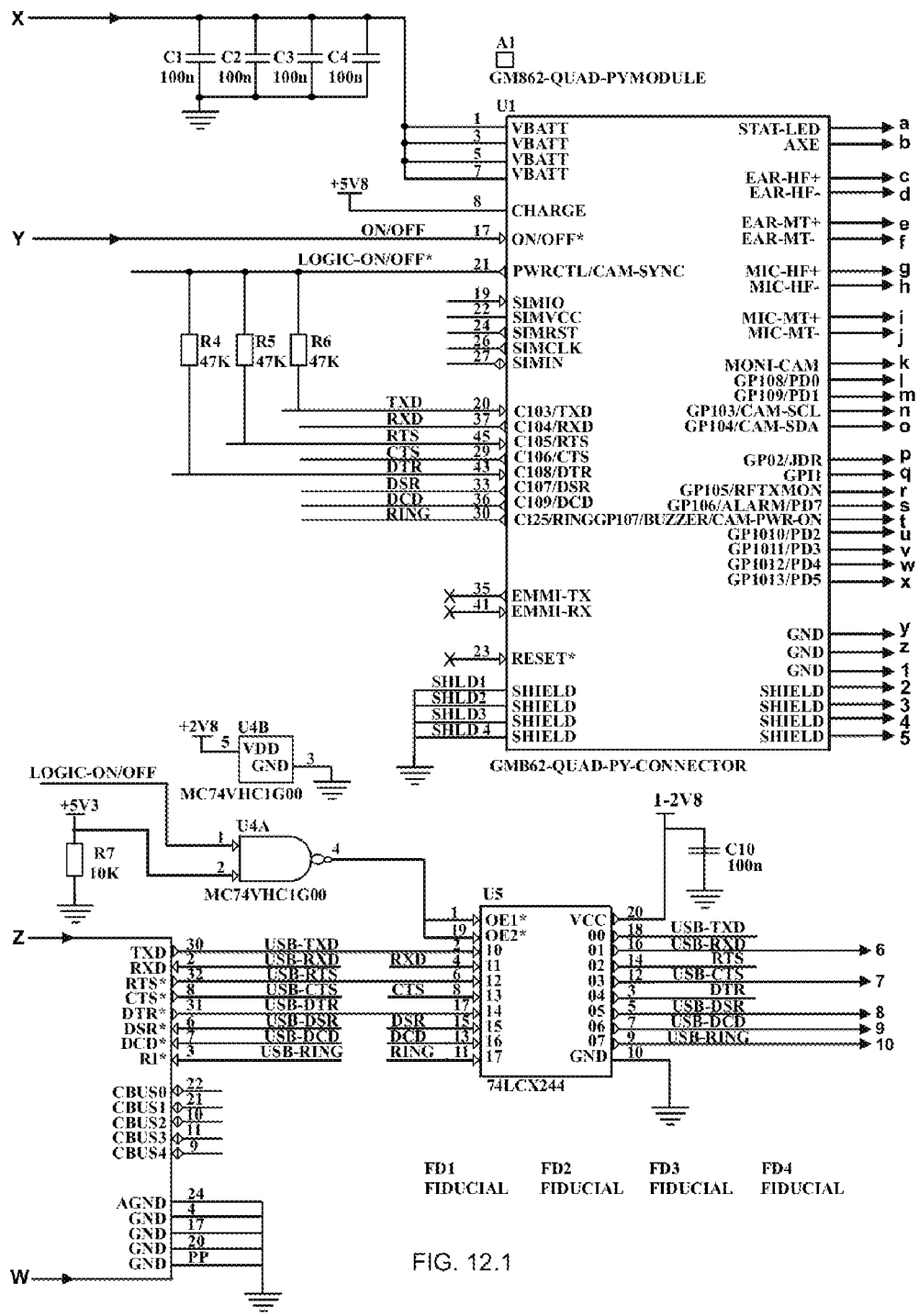
FIG. 12.1

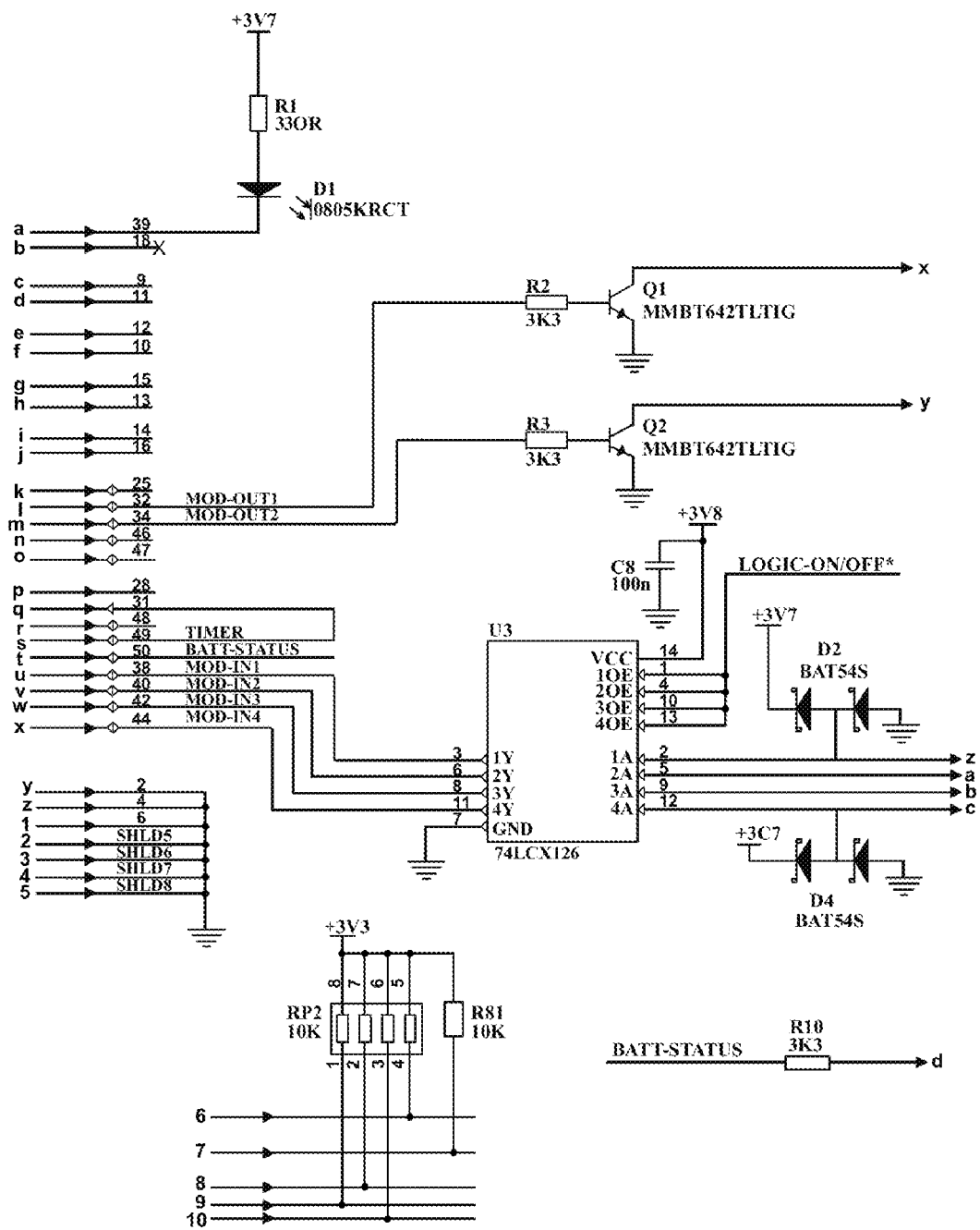
FIG. 12.2

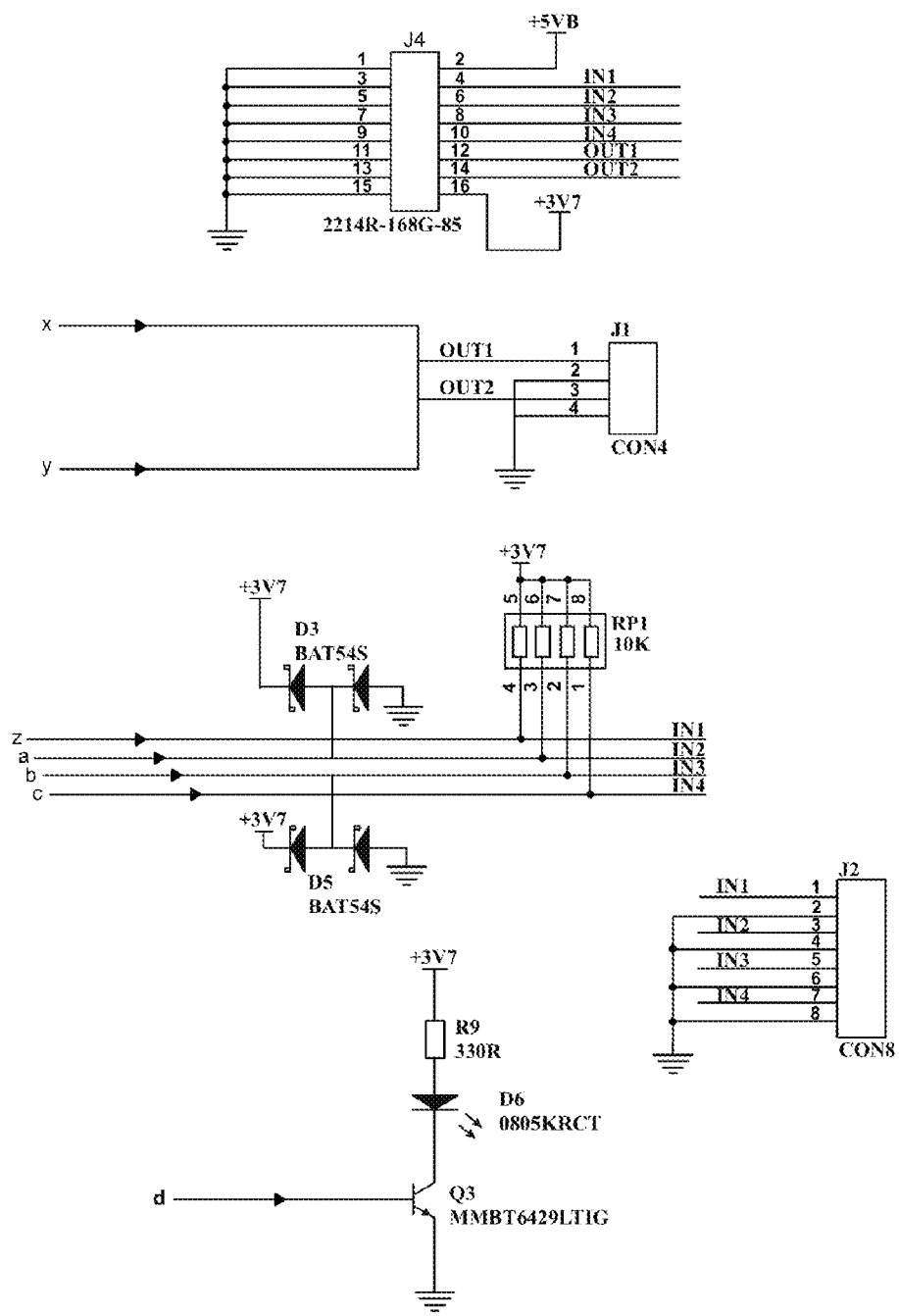
FIG. 12.3

POWER MONITORING AND SIGNAL UNIT

The present invention relates to control and monitoring of electrical and electronic devices and, more particularly, to intelligent power monitoring and signal transmitting and receiving devices.

BACKGROUND

The need to conserve electrical power and use it more efficiently has become a pressing social issue as the impact of fossil fuel based generation becomes more widely understood and economies move towards renewable energy sources.

Energy conservation and use efficiency requires accurate power use monitoring and appropriate action based upon the monitored data. Monitoring devices are known but these generally require specialist installation and, while providing a user with data, are not readily integrated with other smart energy controlling, or general use communication equipment.

It is an object of the present invention to address or at least ameliorate some of the above disadvantages.

Notes
1. The term "comprising" (and grammatical variations thereof) is used in this specification in the inclusive sense of "having" or "including", and not in the exclusive sense of "consisting only of".
2. The above discussion of the prior art in the Background of the invention, is not an admission that any information discussed therein is citable prior art or part of the common general knowledge of persons skilled in the art in any country.
3. For the purposes of this specification, an Individual Signal Unit (ISU) is an electronic device as disclosed and claimed in WO/2008/006155 and WO/2008/134810 to the Applicant. The disclosure of WO/2008/006155 and WO/2008/134810 including specification, claims and drawings is incorporated herein by cross reference.

BRIEF DESCRIPTION OF INVENTION

Accordingly in one broad form of the invention there is provided a power monitoring and signal unit; said unit provided with projecting connectors at a first face and sockets for receiving like connectors in a second opposite face; said unit provided with circuitry for monitoring power flow through said unit when said projecting connectors are plugged into a mains power outlet; said unit further provided with transceiver circuitry for:
 a. Transmission of data including command and control data
 b. Reception of data including command and control data Preferably said unit incorporates a communication device for transmission of power use data to a remote receiving unit.

Preferably said unit includes one or more sensors for detection of proximate environmental parameters.

Preferably said transceiver circuitry includes short range wireless communication protocols.

Preferably said remote receiving unit is a mobile phone.

Preferably said remote receiving unit is an individual signal unit.

Preferably said remote receiving unit is a Wi-Fi router in communication with one or more nominated receiving entities over the Internet.

Preferably said rewrote receiving unit is a like monitoring unit configured as a slave unit under control of a designated master said monitoring unit.

Preferably said unit is provided with relay circuitry for on/off control of power flow through said monitoring unit.

Preferably said power flow is mains power flow.

Preferably said parameters include proximate ambient temperature.

Preferably said parameters include proximate lighting levels.

Preferably said parameters include motion sensing.

Preferably said unit transmits power usage data of a power consuming appliance or device connected to said sockets.

A power monitoring and signaling unit registered by an owner of said unit with a central control facility of a monitoring system; each said unit including:
 a transceiver module,
 a power monitoring circuit,
 a logic circuit,
 at least one event sensor,
 connector pins for connection of said unit to a mains power outlet,
 sockets for receiving like connector pins of a power plug for connection to said power monitoring and signaling unit.

Preferably data from a said unit to a central control facility causes said central control facility to execute a registered owner-assembled schedule of one or more predefined steps: at least some of said predefined steps configured or reconfigurable by said owner of said unit from said web site; at least some of the predefined steps provided by one or more independent parties as applications or subroutines and made available for selection on said web site; at least some predefined steps configured or reconfigurable by said independent parties; said predefined steps including notification of receipt of a said signal or data from said unit to recipients nominated by said owner.

Preferably the power monitoring and signal unit as defined above or elsewhere in this specification operates in combination with and in communication with an individual signal unit registered by an owner of said individual signal unit with a central control facility of a monitoring system; each said individual signal unit including:
 a transceiver module,
 a power supply,
 a logic circuit,
 at least one of a number of event sensors,
 and wherein a signal from a said individual signal unit to a central control facility causes said central control facility to execute one or more predefined steps; at least some of said predefined steps configured or reconfigurable by an owner of said individual signal unit; at least some of the predefined steps provided by one or more independent parties; at least some predefined steps configured or reconfigurable by said independent parities; said predefined steps including notification to recipients nominated by said owner, of receipt of a said signal from said individual signal unit.

Preferably the power monitoring and signal unit as defined above or elsewhere in this specification operates in combination with and in communication with a monitoring system; said monitoring system including an individual signal unit (ISU); said individual signal unit registered by an owner of said individual signal unit with a central control facility; said individual signal unit communicating with said central control facility when an event sensor activates said individual signal unit; said central control facility executing a number of predefined steps on receipt of a communication from said individual signal unit; at least some of said predefined steps configured or reconfigurable by an owner of said individual signal unit; at least some of the predefined steps provided by one or more independent parties; at least some predefined steps configured or reconfigurable by said independent parties; said predefined steps including notification to recipients nominated by said owner, of receipt of a said communication from said individual signal unit.

Preferably communication between said individual signal unit and said central control facility is not limited by distance.

Preferably said individual signal unit may be located at any location relative said central control facility.

Preferably said individual signal unit is mobility independent of said central control facility.

Preferably said communication between said individual signal unit and said central control facility is by means of any communication network.

Preferably said predefined steps include a communication between said central control facility and a said owner or registered user of said individual signal unit.

Preferably said communication between said central control facility and said owner or registered user is by means of any communication network.

Preferably said predefined steps may include a first layer and a secondary layer of said predefined steps.

Preferably selected ones of said secondary layer of predefined steps may be executed by said central control facility in accordance with a reply to a said communication between said central control facility and a said owner or registered user.

Preferably said individual signal unit is programmable.

Preferably said individual signal unit includes a display.

Preferably said individual signal unit is configurable to accept signal input from any external sensing device.

Preferably said individual signal unit is configurable to allow output signals to any said communication network.

Preferably said individual signal unit is adapted for integration into products as an original equipment manufacture (OEM) module.

Preferably said central control facility includes a database and a server; said central control facility maintaining an internet web site on said server.

Preferably said system provides a means of asset monitoring; said asset monitoring alerting a said owner or registered user to an incident affecting a said asset.

Preferably said predefined steps include activation of an output device connected to a said individual signal unit.

Preferably data flow between a tool source and said central control facility is bidirectional.

Preferably data flow between said central control facility and an individual signal unit is bidirectional.

Preferably data flow between said central control facility and a user computer is bidirectional.

Preferably said independent party provides a pre-programmed tool and associated pre-programmed ISU.

Preferably said independent party provides follow-on services in response to a particular event detected by an ISU.

Preferably the follow-on services are provided by a freelance provider.

Preferably the freelance provider advertises their availability on a website controlled by said central control facility.

Preferably said independent party engages the services of said freelance provider.

Preferably control of event monitoring is passed to said central control facility by said owner.

Preferably said independent party advertises on said website in association with tool provision.

Preferably the power monitoring and signal unit as defined above or elsewhere in this specification operates in combination with and in communication with an individual signal unit registered by an owner of said individual signal unit with a central control facility of a monitoring system; said individual signal unit including:

e) transceiver module,
f) a power supply,
g) a logic circuit,
h) at least one event sensor, and wherein a signal from said individual signal unit to said central control facility causes said central control facility to execute one or more predefined steps; at least some of said predefined steps configured or reconfigurable from a first external source; at least some of the predefined steps communicated from a second external source; at least some predefined steps configured or reconfigurable from said second external source; said predefined steps including notification to recipients nominated by an owner of said individual signal unit, when in receipt of a said signal from said individual signal unit.

Preferably the power monitoring and signal unit as defined above or elsewhere in this specification operates in combination with and in communication with a monitoring system which includes an individual signal unit registered by an owner of said individual signal unit with a central control facility of a monitoring system; said individual signal unit communicating with said central control facility when an event sensor activates said individual signal unit; said central control facility executing at least one predefined step on receipt of a communication from said individual signal unit indicating the occurrence of a predefined event; at least some of said predefined steps configured or reconfigurable over a bidirectional link from a first source; at least some of the predefined steps provided over a bidirectional link from a second source; at least some predefined steps configured or reconfigurable over said bidirectional link from said second source; said predefined steps including notification to recipients nominated by an owner of said individual signal unit, of receipt of a said communication from said individual signal unit.

Preferably the power monitoring and signal unit as defined above or elsewhere in this specification operates in combination with and in communication with a monitoring system in communication with a programmable sensor device; the device comprising an individual signal unit registered by an owner of said individual signal unit with a central control facility; said individual signal unit with a communicating with said central control facility when and event sensor activates said individual signal unit; said central control facility executing a user-assembled schedule of predefined steps on receipt of a communication from said individual signal unit; said predefined steps configured or reconfigurable by an owner of said individual signal unit from a web site; at least some of the predefined steps provided by one or more independent parties and made available for selection on said web site; at least some predefined steps configurable or reconfigurable by said independent third parties; said method comprising permitting said independent parties to provide said steps to said central control facility via said web site; permitting said owner to register with said central control facility via said web site so as to become a registered owner; permitting said registered owner to select one or more said steps via said web site for execution by said central control facility responsive to communication received from said individual signal unit.

Accordingly in a further broad form of the invention there is provided a power monitoring and signal unit; said unit is provided with projecting connectors at a first face and sockets for receiving like connectors in a second opposite face; said unit provided with circuitry for monitoring power flow through said unit when said projecting connectors are plugged into a mains power outlet; said unit further provided with transceiver circuitry for:

Transmission of Data Including Command and Control Data

Reception of data including command and control data said unit including a processor which executes predefined steps; said predefined steps configured or reconfigurable by external means.

Preferably said external means comprises a pluggable module in communication with said unit.

Preferably said external means comprises an ISU.

BRIEF DESCRIPTION OF DRAWINGS

Preferred embodiments of the present invention comprising modifications and improvements to the capability of the ISU of WO/2008/006155 and WO/2008/134810 will now be described with reference to the accompanying drawings wherein:

FIG. 2 is a first perspective view of a preferred embodiment of the improved signal unit according to the invention, FIG. 3 is a second perspective view of a preferred embodiment of the improved signal unit according to the invention.

DETAILED DESCRIPTION OF PREFERRED EMBODIMENTS

Figure 1:
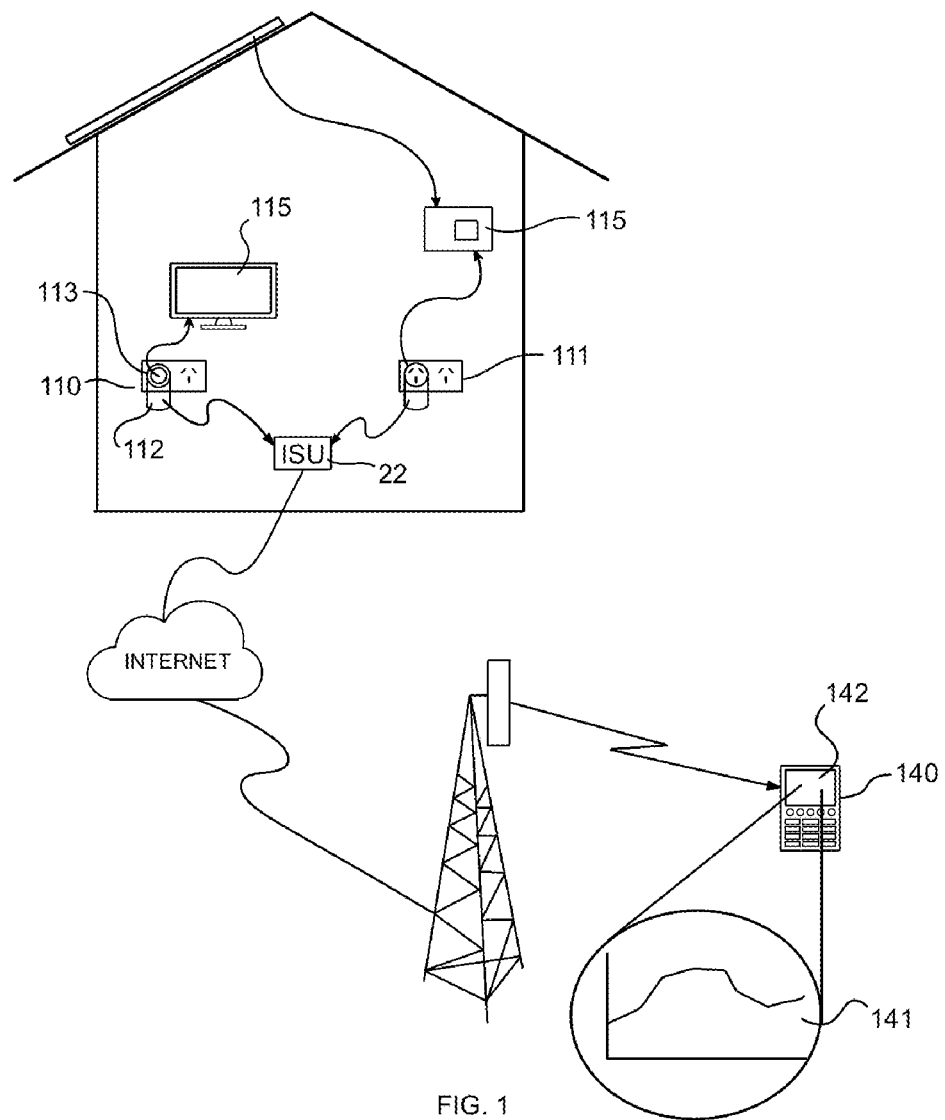
FIG. 1 is a diagram of an improved unit according to an embodiment of the invention in use in a domestic context.

Preferred embodiments of the present invention provide for a small compact power monitoring and sensing unit 110 as for example shown in FIGS. 1, 2 and 3. In a preferred form, the unit 110 comprises an enclosure 112 provided with connector pins 114 projecting from a first side 116 and sockets 118 for receiving like connector pins at a second opposite side 120. The structure of the unit 110 is such that it may be plugged into a mains electrical power outlet 111, and in turn receives an appropriately configured electrical plug 113 of any mains powered electrical device.

In preferred forms circuitry within the unit 110 is adapted to monitor current flow through the unit to an accuracy of better than .+−0.50 mA. Power flow, including voltage and current is sampled some hundreds of iterations per second to enable micro management. The logic circuitry of the unit is able to provide a power usage profile of an electrical device 115 connected to it.

In addition to the power monitoring and logic circuitry, the unit of the invention is provided with a transceiver module for transmission and reception of data using short range wireless communication technology, for example Wi-Fi and Bluetooth protocols. Data may be transmitted to, or received from any suitable transmitting or receiving device, including an Individual Signal Unit (ISU) as described in WO2008/134810, the contents of which are incorporated into this specification by reference. Data may also be transmitted to, and received from, nominated entities over the internet via Wi-Fi and a wireless router. Communication between nominated users and the unit may also be by means of a suitable mobile phone over a mobile phone network, or directly by Wi-Fi, Bluetooth or similar technology between the unit 110 and a communication device such as a mobile phone.

The unit of embodiments of the invention may further be provided with one or more environment sensing devices, including for example ambient temperature and light level sensors and a movement (PIR) sensor.

A programmable logic (CPU) chip incorporated in the unit may be configured to switch the mains power flow through the unit to on or off, depending on either the monitored power flow level, or input received from any of the incorporated sensors. As well the unit 110 is enabled to receive radio commands to switch the load connected to the unit either on or off.

In one preferred embodiment, in a given environment such as a room or office, one signal unit may act as a command unit communicating with other slave signal units. Thus the command signal may for example process power consumption of a particular item of electrical equipment and combine this data with a sensor input so as to determine a course of action to be communicated to the slave units. This may include switching the status of the power supplied to other electrical equipment connected to the slate units, or the transmission of monitored data from those units for example.

Configuration of the CPU may further include the transmission of data in respect of any of the elements monitored by the unit. Such data may include for example the switching of remote appliances or electrical systems provided with appropriate intelligent receiving capabilities. A default configuration of the CPU may occur at time of manufacture of the unit, but custom configuration by a user may be provided either via the ISU referred to above, over the internet or over a mobile phone or similar communication device. Custom configuration may include the up-loading to the unit 110 of special applications programmed by independent third parties and made available over the internet.

In one preferred embodiment of the invention, the signal unit of the invention may be registered and communicate with, a central control facility (CCF) as described in WO/2008/006155 and WO/2008/134810. The CCF maintains servers and databases which store protocols for procedures associated with data which may be received from a signal unit registered with the CCF by an owner of that signal unit. These protocols will direct certain steps to be executed by the CCF dependent on the data received from the signal unit. Steps executed by the CCF may include the switching to off or on of power flow through a unit as noted above, or interrogation of sensors.

The improved signal units of preferred embodiments of the invention provide a powerful method of monitoring and controlling power usage. A number of the units may be distributed around a house or office building, plugged into power outlets, so as to report on individual power usages of appliances connected at these outlets. Software enabled on suitable receiving devices, such as the ISU, mobile phone or other communication device, can then display instantaneous power use of individual appliances or a record of past usage, and allows a grouping of two or more usages to assess cumulative power usage.

If a photovoltaic system is installed, the unit, when suitably connected to the solar power generating circuit, can monitor and display the power generated and any net power either received from, or provided to, the mains electricity grid.

It will be understood that, given the power monitoring capability combined with environmental sensing functions incorporated in the unit, the software may be configured to provide a variety of data outputs depending on the preferences of a user.

Figure 4:
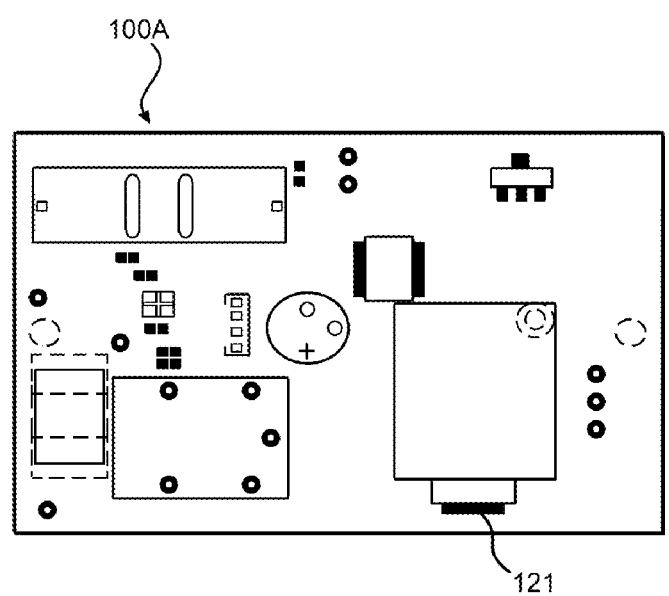
FIG. 4 is a plan view of a circuit board of an implementation of an improved wall unit in accordance with an embodiment of the present invention.
Figure 5:
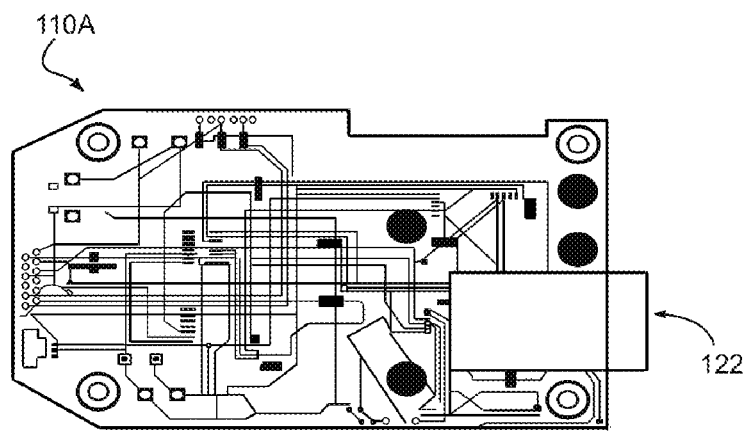
FIG. 5 is a further plan view of the circuit board of the implementation of FIG. 4 showing insertion of a pluggable module therein.
Figure 6:
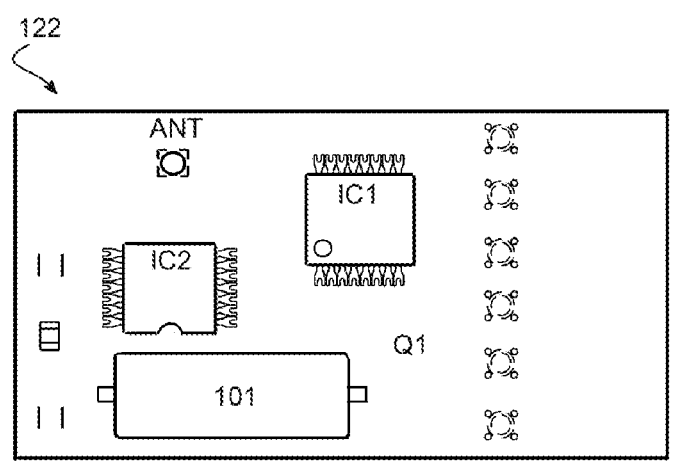
FIG. 6 is a plan view of the pluggable module utilized in the embodiment of FIG. 5.
Figure 7:
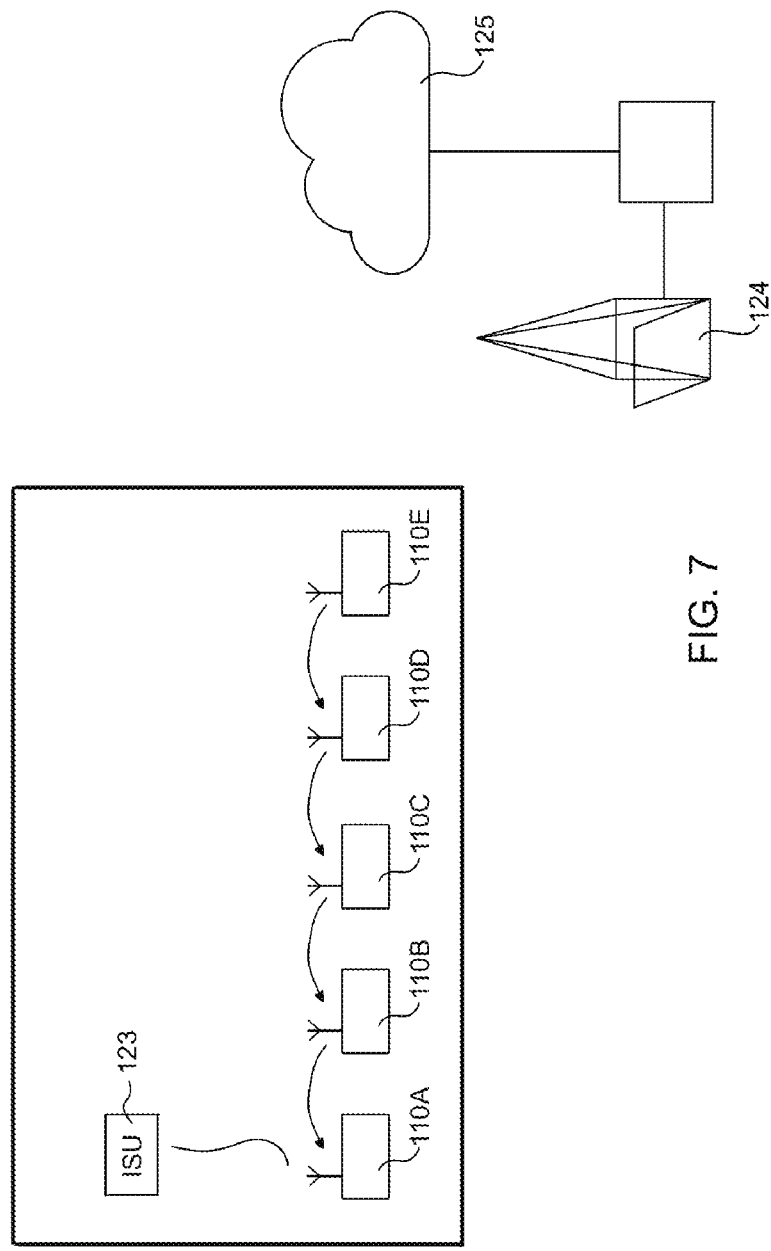
FIG. 7 is a diagrammatic view of communication between a multiplicity of signal units in accordance with an embodiment of the present invention.

FIG. 4 illustrates a circuit board 110A for a wall unit comprising a power monitoring and sensing unit 110 and including at least one plug-in point 121. The plug-in point 121 is adapted to receive a pluggable module 122. The pluggable module 122 is shown inserted in a circuit board 110A of a power monitoring and sensing unit 110 in FIG. 5. The plugged module allows for functionality to be added to the unit 110 in a flexible way. In particular it allows addition of functionality which may not be able to be achieved merely by programming of the on-board microprocessor on circuit board 110A. In one form the pluggable module 122, as illustrated in FIG. 6, may take the form of an RF433 module adapted for connection to an SD-style connection point.

The communications capability conferred by the RF433 module may allow, for example, individual units 110 to communicate with other like units 110 located in the same environment. In preferred forms the communication range may be limited with the intention that where a board 10E wishes to communicate with an ISU 123 but is not within direct range of the ISU 123 it may yet communicate with ISU 123 by a daisy chain arrangement whereby board 110E communicates with adjacent board 110D which in turn communicates with adjacent 110C, thence to board 110B, thence to board 110A, which finally, communicates with ISU 123 the information which board 110E wished to impart to ISU 123. This "mesh" capability permits the effective range of communication of any individual monitoring and sensing unit 110 to be increased well beyond its own specific range. The ISU 123, in turn, may communicate with an external communications tower 124, typically mobile telecommunications tower, for example via the GSM system which in turn permits communication over the internet and thence to a master database of the type described elsewhere in this specification and also in the Applicant's earlier filed WO/2008/134810 International Patent Application.

Figure 8:
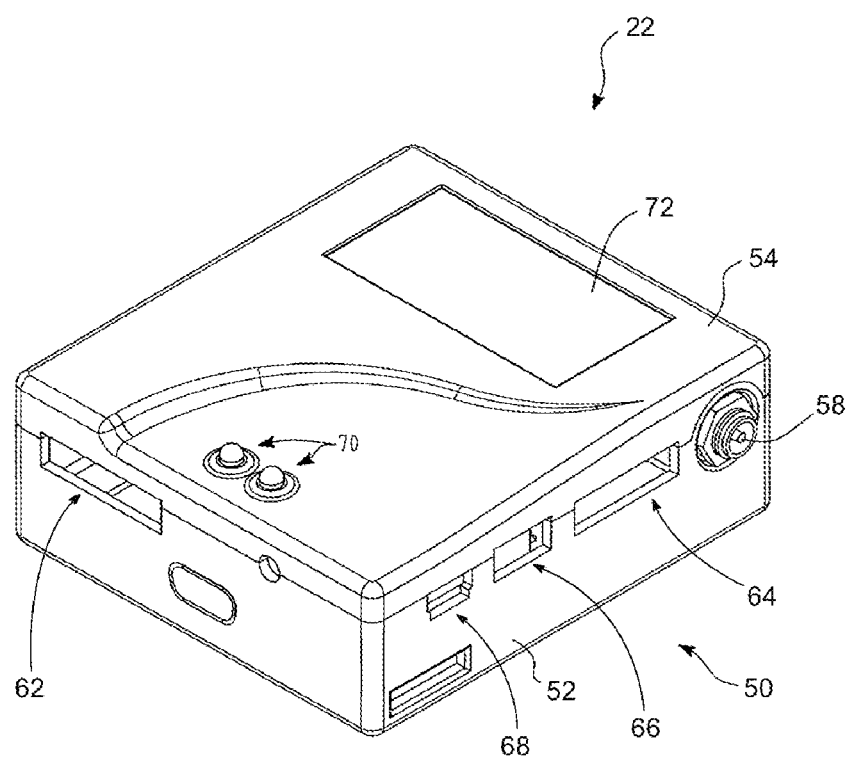
FIG. 8 illustrates an individual signal unit (ISU) as disclosed WO/2008/134810.

With reference to FIGS. 8 through to 12 there is illustrated an ISU unit 22 and a methodology for its use. The ISU 22 is adapted for communication with the power monitoring and signal unit 110 described above whereby the two units work together to achieve functionality which neither on its own can achieve. In effect the functionality of both units is extended when operating in concert and in communication with each other.

As illustrated in the inset in FIG. 1 the power data, for example, monitored on the unit 110 can be communicated via the ISU 22 to a screen on a portable digital device 140 and represented graphically as graph 141 on a screen 142 of the portable device 140. The same portable digital device 140 can be used to enter control parameters for programming and reprogramming of the unit 110 via the ISU 22.

The following detailed description builds on the description given in the applicant's earlier filed International Patent Application PCT/AU2007/000958. In this instance, the features of note relate to the "community of development" which the basic system as previously described engenders and in respect of which enabling disclosure is provided below. From one view the system provides control over assets via the Internet irrespective of distances involved and the mobility of the controller or the asset and requiring only simple "do-it-yourself" installation. The system is configured by the user via the Internet. The tools available for configuration by the user can be provided in a wiki-style collaboration by a multiplicity of independent parties allowing the features available to grow in a collaborative context over time. Specific embodiments of the individual signal units 22 are themselves programmable and re-programmable and configurable and re-configurable in response to the imagination of the users and the tools provided by the collaborating independent parties.

First Preferred Embodiment

Figure 9:
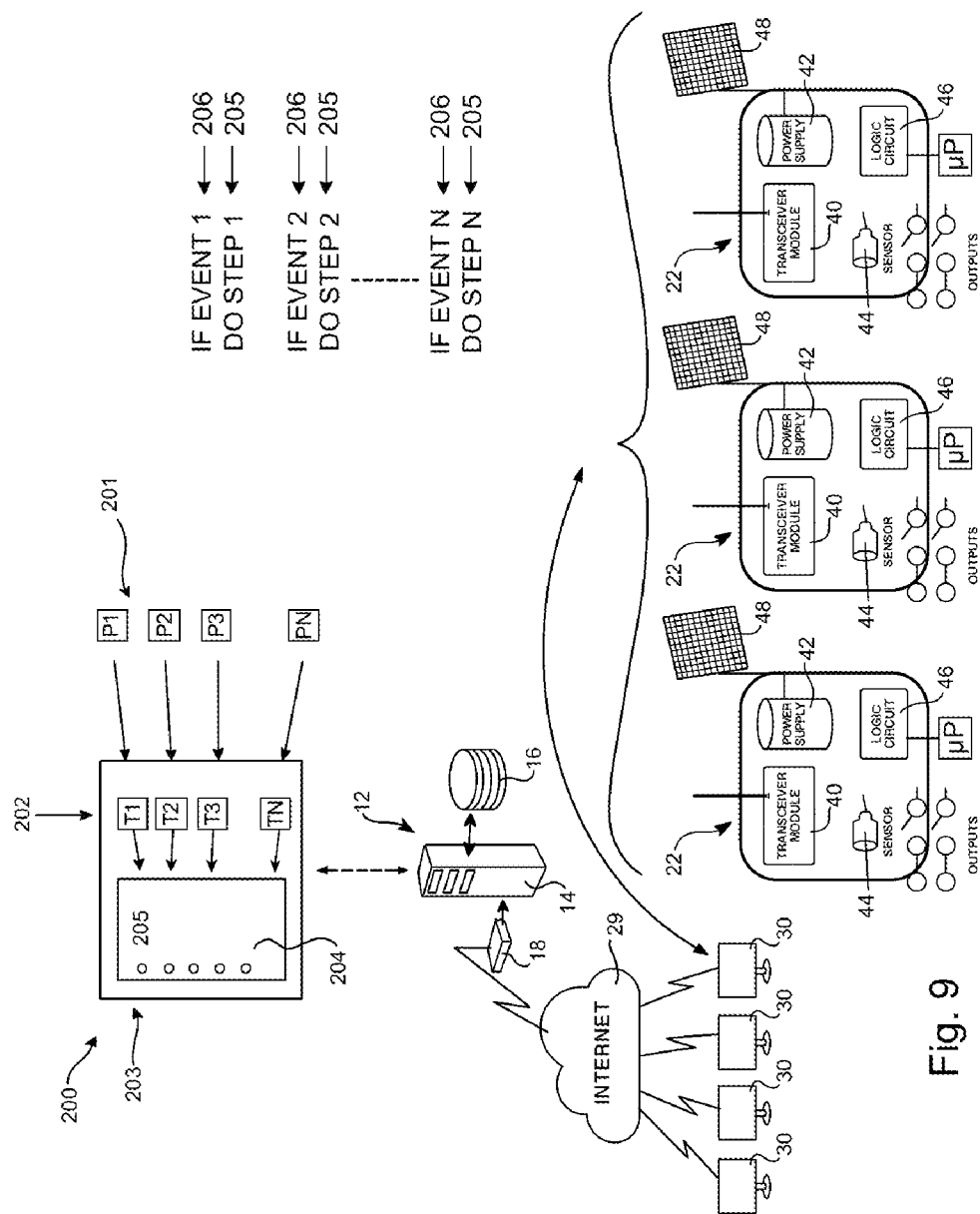
FIG. 9 is block diagram of the manner of usage and communication with the ISU of FIG. 8.

With reference to FIG. 9 there is shown a reconfigurable, collaboratively expandable monitoring system 200 in accordance with a first preferred embodiment of the present invention. In this instance the system comprises components as described with reference to FIG. 10 (see below). The emphasis in this instance revolves around the reconfigurability and collaborative input of the system 200 whereby independent third party providers 201 (in this instance, labelled P1, P2, P3 . . . PN) provide respective tools 202 (in this instance, respectively nominated T1, T2, T3 . . . TN), which tools are available for the user/owner/nominated recipient 30 of a respective one or more individual signal units 22 to utilise so as to define steps or actions to occur in response to events detected and reported by the individual signal units 22. The tools 202 are made available to a user 30 preferably via a web interface screen 203 which will include a tool assembly pane 204 where an individual user 30 can assemble a schedule of predefined (predetermined) steps 205 (step 1, 2, 3 . . . N) to in response to events 206 (event 1, 2, 3 . . . N). The manner of assembly of the predefined steps is described in more detail further in this specification. In this way a user 30 of one or more of the individual signal units 22 can program responses to events detected by the individual signal units 22 using tools 202 selected from an ever-increasing number of tools based on tools supplied by independent party providers 201.

Figure 10:
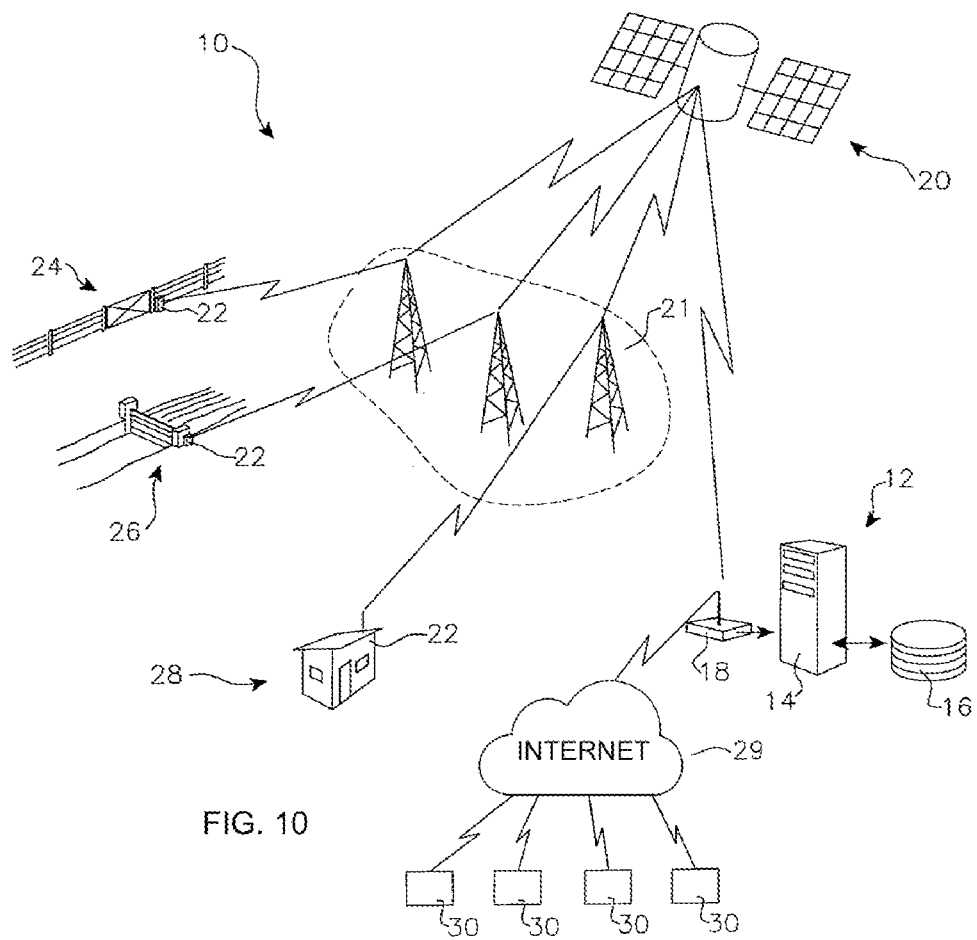
FIG. 10 is a further diagram illustrating communication with the unit of FIG. 8.

FIGS. 9 and 10 are diagrammatic representations of the apparatus and connections included in a monitoring system 10 according to a preferred embedment of the invention. A central control facility 12 includes a data processing server 14 and data storage 16, linked to a transceiver 18. Central control facility 12 is in radio communication with a communication network such as a mobile phone network, or for example as shown in FIGS. 9 and 10, with at least one communication satellite 20, by means of transceiver 18.

In the example of a communication satellite 20, it in turn, is in telecommunication contact with a number of the individual signal units 22, for example via the Global System for Mobile Communications (GSM), the General Packet Radio Service (GPRS) or a similar communication network 21. The Individual signal units 22 belong to registered users of the system and may be located anywhere within the signal footprint of a communication satellite (or satellites) 20, or of some other communication network.

The Individual signal units 22 each are assigned a unique identifying code, and may take a number of physical configurations depending on the environment in which they are to be located. FIG. 8 shows one preferred form of an individual signal unit, comprising enclosure 50 with various input and output devices. In some preferred forms at least, they will comprise a rugged, moisture and tamper-proof outer casing with internal power supply and a selection of bracketry and other attachment means for affixing the devices to a variety of structures and surfaces. In other preferred forms the device may be incorporated in an item of equipment at manufacture, for example in the lantern structure of street lights.

The apparatus of a monitoring system may include a number of standard sensor devices available for purchase along with, or in addition to the individual signal unit 22. Each sensor device is adapted to respond to a predefined stimulus, and may include sensors for power status, smoke detection, motion detection, door or window opening, button press, fluid level, tampering, location via the GPS system and video camera, for example. These standard sensor devices are provided as a simple plug-in to the individual signal unit 22, via one of the input connection 64 or USB port shown in FIG. 4, or other standard interface ports provided on the device.

An individual signal unit 22 may further be provided with internal error monitoring facilities, each as a power supply failure. Preferably also, individual signal units 22 are equipped with interference sensors to alert the central control facility 12 of tampering by unauthorised persons, or disturbance by animals for example.

Individual signal units 22 is at least one preferred embodiment, are provided with output relays to activate one or more external devices according to pre-programmed responses to sensor monitored events. Examples may include the activation of audio and/or visual alarms, the switching on of security lighting, closure of fire doors and so forth.

The power supply and control module 42 is adapted to maintain individual signal unit 22 in a passive, standby state until receiving a signal from an external event sensor. Such a signal initiates a powering up of the device, enabling it to transmit its unique encrypted identifying code to the central control facility. After transmission of this signal the individual signal unit powers down and returns to its passive standby state.

An individual signal unit 20 may also be brought into a powered up state on command from the central control facility 12. This powering up may be for the purpose of re-programming the individual signal unit 22 to install a new response procedure, for example after the installation of a new, or an additional external event sensor, relocation of the unit, or to modify an existing procedure.

Where an individual signal unit 22 is provided with data entry and display facilities, such programming or re-programming of the unit may be performed at the device itself.

At the conclusion of such local data input, the new or modified data is transmitted to the central control facility to update its responses to any signals received from the individual signal unit as required.

Referring again to FIGS. 9 and 10, during a powered up state, as well as following any pre-programmed procedure for the activation of any local connected devices, individual signal unit 22 will transmit a signal via the network 21 and a satellite 20, reporting the event to the central control facility 12.

In a first simplest preferred form of the invention, a signal sent by an individual signal unit 22 consists solely of the ISU 22 unique encrypted identifying code. No data is sent with this code. The information as to what a receipt of this code by the central control facility means, is stored in the central processing computers of the facility. This information, which is supplied by and under the control of the registered owner of the individual signal unit, may include instructions as to what actions are to be taken in response to the signal.

Although in this preferred form of the invention, the individual signal unit 22 is only enabled to transmit a single encrypted identifying code, it may do so in various ways to indicate various events. Each external event sensor is associated with a unique sequence of repeat transmissions of said unique identification code. For example if an external sensor device is activated, the code may be transmitted a predefined number of times for that particular sensor at short intervals. However should an error condition develop in the device itself, such as for example a low battery situation, the code may be transmitted singly. The manner of transmission of this single encrypted code is then the determinant of the status of the device and of what action should be taken by the central control facility.

According to its pre-programmed instructions, an individual signal unit 22 may continue to transmit its signal at intervals for a predefined period as an aid in location of the device by service personnel alerted by the central control facility 12 as described below.

Again with reference to FIGS. 9 and 10, a received signal is acted upon by the central control facility 12, notifying any of a number of nominated recipients 30 according to a pre-established protocol negotiated between the registered user of the individual signal unit 22 and the control facility. Notification of details of a monitored event could be made in the form of an email via the Internet 29 as shown in FIGS. 9 and 10, by facsimile transmission or over the distributed network 21 to any personal communication device.

Typically, one nominated recipient 30 will be the registered user or owner of the individual signal unit from which the alerting signal was received. However nominated recipients may also include service providers, who are automatically notified of the occurrence and the nature of the event, the location of the individual signal unit and any other predefined details. Service providers may include police, fire and ambulance services, or equipment servicing personnel for example. At registration of an individual signal unit, the owner of the unit may elect that independent third parties be contacted only on receipt by the central control facility of authorisation from the owner.

An applicant user or owner will be required to supply all relevant details of the individual signal unit, its external event sensing faculties, intended location and the procedures to be implemented on receipt of a signal from the device. The central control facility then issues the unique identification code for the individual signal unit. Alternatively, an individual signal unit may be pre-programmed at manufacture with its unique identifying code. As well, the applicant user or owner nominates a service provider of the GSM, GPRS or other communication system, for billing purposes, or alternatively, the central control facility makes this arrangement, with billing for such service included in the overall charge for use of the system.

The information thus received is used by the central control facility to program the procedure to be followed by the facility in response to signals received from the individual signal unit. The facility may also transmit data to the individual signal unit prior to its commissioning but subsequent to its installation at the infrastructure item, to set the parameters of signal transmission, such ae frequency and interval of repeat transmissions for example.

With reference to FIG. 4 which shows an exploded view of one preferred form of an individual signal unit 22, enclosure 50 comprises a base portion 52 and cover portion 54. Housed within enclosure 50 are a communication module 56, for example using the General Packet Radio Service (GPRS) standard for communication with a communication network, and antenna jack 58. Also contained within enclosure 50 is a rechargeable battery module 60, and various input and output connections, including power input/outputs 62, sensor inputs 64, device relay connections 66 and a universe serial bus (USB port) 68. Individual signal unit 22 way also be provided with status indicating light emitting diodes (LEDs) 70. Enclosure 50 is provided with a space, for example space 72 on cover 54, for display of a code used in the registration of the unit with the central control facility.

Each individual signal unit 22 is adapted to monitor the status of some aspect of an item of infrastructure, such as for example illustrated in FIGS. 9 and 10, a gate 22, irrigation control sluice 24 or tool shed 26.

Figure 11:
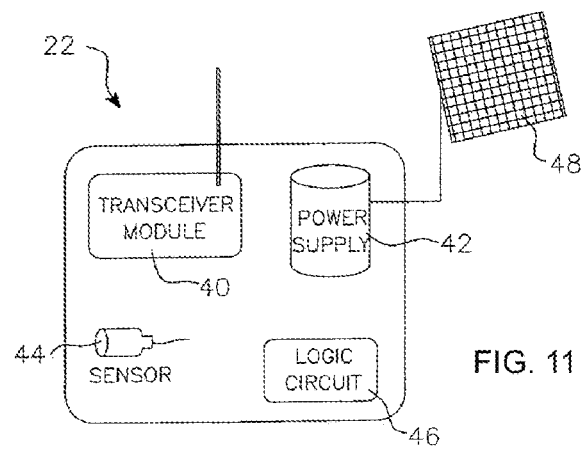
FIG. 11 is a block diagram of the ISU of FIG. 8.

As shown in the schematic of FIG. 11, individual signal units 22 include at least a transceiver module 40, a rechargeable power supply and power control module 42, at least one external event sensor 44 and a logic circuit 46. For some applications, an individual signal unit may be provided with, or connected to, a magnetic card reader, enabling inspecting personnel to simply swipe an authorising card as confirmation that the individual signal unit is in its proper position and functioning, or that some predefined task has been accomplished.

Preferably, the power supply 42 is rechargeable by means of a solar panel 48, but may also comprise batteries rechargeable from a mains power source, or replaceable battery packs. Where an individual signal unit has been incorporated in some item of infrastructure already provided with a power supply, such as in the street light example, power to the unit may be provided from that external supply.

An individual signal unit 22 may be provided with at least one external event sensor 44 incorporated within the device itself, but individual signal units 22 are more preferably provided with a sensor interface allowing the unit to accept signals from a number of external event sensors connected to the interface. Thus for example, an individual signal unit 22 may monitor a number of aspects of a remotely located facility, such as the doors and windows of a building or various items of equipment located on a service vehicle.

Figure 12:
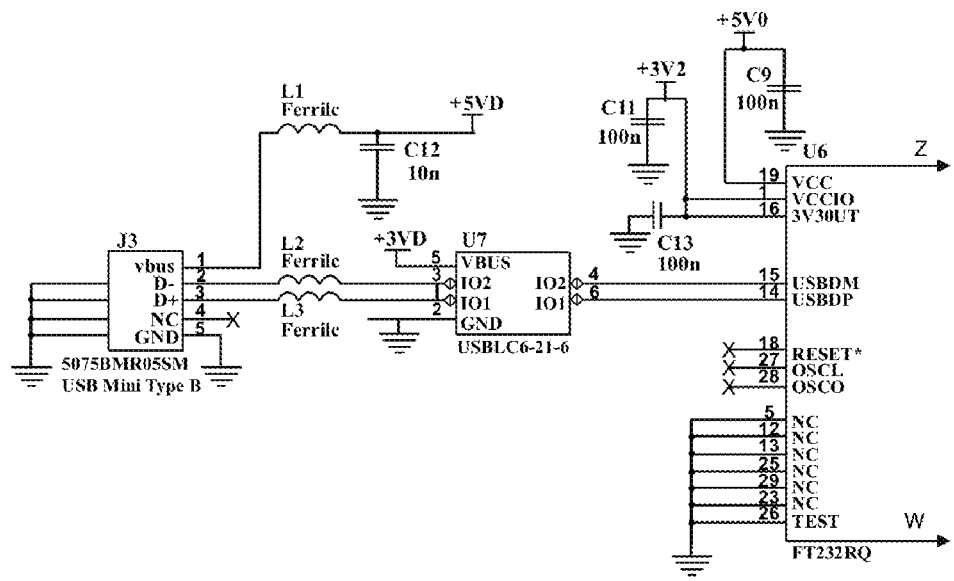
FIG. 12 is a schematic diagram of one implementation of the ISU of FIG. 8 adapted for communication and interaction with the improved signal unit of any one of FIGS. 1 to 7.

With reference to FIG. 12, the ISU may include the following components. GSM Engine 74.

This is the central core of the device. It includes a GSM transceiver allowing the module to connect to and communicate over the GSM network. The transceiver also makes use of the GPRS capability of the GSM network to connect to a server of the central control facility using IP sockets. The GSM engine also includes a basic Python script interpreter to run application scripts (software) and a battery charger 75 to allowing the charging of a LiIon battery pack (connected via J5 on the circuit diagram of FIG. 12).

The application scripts (software) loaded into the GSM engine 74 allow the module to monitor the external sensors and devices connected to the ISU device and generate messages over the GPRS network to the central control facility server whenever there is a change in the status of these external sensors or devices. The typical operation will be for the GSM engine to connect to a known IP socket on a server at a known IP address. The message passed to the server via this connection will include the identification of the ISU device (typically the phone number associated with the SIM card) and the details of the input status change.

The GSM engine has a push button switch (Si on the circuit diagram of FIG. 12) which allows the GSM engine to be turned on and off.

Network Status Indicator (D1 on Circuit Diagram)

An LED (light emitting diode) is provided to give an indication of the status of the ISU device. When the LED is permanently off, the device is powered down. When the LED is blinking quickly (approximately 1 second period), the GSM engine is searching for the GSM network and attempting to register itself with the network. When the LED is blinking slowly (approximately 3 second period), the GSM engine has registered itself with the GSM network and is in a state that will allow it to make a connection with a server should one of the inputs change state. When the LED is permanently on, there is an active call being made by the device.

Battery Status Indicator (D6 on the Circuit Diagram)

A visible indication of the charge status of the battery is provided using an LED (light emitting diode).

USB Connection (J3 on the Circuit Diagram)

The ISU device has a USB connection to allow the module to be connected to a Personal Computer. This connection allows the application scripts (software) to be updated in the GSM Engine. Power is also drawn from the Personal Computer to recharge the LiIon battery. The power for the USB interface device (U6 on the circuit diagram) is taken from the USB connector. This minimises the current drawn from the LiIon battery to extend the operational time between charges. Interface components (U4 and U5 on the circuit diagrams) isolate the connections between the USB device and the GSM engine when either the USB port is disconnected (USB device powered down) or the GSM engine has been turned off. A protection device (U7 on the circuit diagram) has been included on the USB port to protect the USB device from electrostatic discharge onto the pins of the USB connector.

External Sensor Inputs (IN1-4 Signals on the Circuit Diagram)

The prototype ISU device implements 4 external sensor inputs. These connections are available on a dedicated input connector (J2 on the circuit diagram) and on the special attachment connector (J4 on the circuit diagram). These inputs have been configured to allow external sensors to simply connect these input signals to a 0 Volt return signal (available on both connectors) using a relay contact closure. This is the typical output from a wide range of sensors.

An interface component (U3 on the circuit diagram) is provided to isolate the input signals from the GSM engine when the GSM engine has been turned off. There are also some protection devices (D2-5 on the circuit diagram) to protect the inputs of the interface component from electrostatic discharge onto the pins of the connectors.

Controlled Outputs (OUT1 and OUT2 Signals on the Circuit Diagram)

The prototype ISU device implements 2 controlled outputs. These outputs allow external devices to be switched by the ISU device. These outputs are implemented using transistors Q1 and Q2. The connections to external devices can be made either by the dedicated output connector (J1 on the circuit diagram) or the special attachment connector (J4 on the circuit diagram).

Special Attachment Connector (J4 on the Circuit Diagram)

A special attachment connector has been provided on the ISU device to allow it to be plugged into purpose built sensors. These sensors will be engineered to accommodate the ISU device and all of the required connections between the two devices are made through the single attachment connector. This connector supports attachments that are self-powered and are capable of providing current to recharge the battery in the ISU, as well as attachments that do not have their own power supply and require current from the ISU device's battery to operate.

The apparatus of a monitoring system may include a number of standard senor devices available for purchase along with, or in addition to the individual signal unit 22. Each sensor device is adapted to respond to a predefined stimulus, and may include sensors for power status, smoke detection, motion detection, door or window opening, button press, fluid level, tampering, location via the GPS system and video camera, for example. These standard sensor devices are provided as a simple plug-in to the individual signal unit 22, via one of the input connection 64 or USB port shown in FIG. 4, or other standard interface ports provided on the device.

An individual signal unit 22 may further be provided with internal error monitoring facilities, such as a power supply failure. Preferably also, individual signal units 22 are equipped with interference sensors to alert the central control facility 12 of tampering by unauthorised persons, or disturbance by animals for example.

Individual signal units 22 in at least one preferred embodiment, are provided with output relays to activate one or more external devices according to pre-programmed responses to sensor monitored events. Examples may include the activation of audio and/or visual alarms, the switching on of security lighting, closure of fire doors and so forth.

The power supply and control module 42 is adapted to maintain individual signal unit 22 in a passive, standby state until receiving a signal from an external event sensor. Such a signal initiates a powering up of the device, enabling it to transmit its unique encrypted identifying code to the central control facility. After transmission of this signal the individual signal unit powers down and returns to its passive standby state.

An individual signal unit 20 stay also be brought into a powered up state on command from the central control facility 12. This powering up may be for the purpose of re-programming the individual signal unit 22 to install a new response procedure, for example after the installation of a new, or an additional external event sensor, relocation of the unit, or to modify an existing procedure.

Where an individual signal unit 22 is provided with data entry and display facilities, such programming or re-programming of the unit may be performed at the device itself. At the conclusion of such local data input, the new or modified data is transmitted to the central control facility to update its responses to any signals received from the individual signal unit as required.

Referring again to FIGS. 9 and 10, during a powered up state, as well as following any pre-programmed procedure for the activation of any local connected devices, individual signal unit 22 will transmit a signal via the network 21 and a satellite 20, reporting the event to the central control facility 12.

In a first simplest preferred form of the invention, a signal sent by an individual signal unit 22 consists solely of its unique encrypted identifying code. No data is sent with this code. The information as to what a receipt of this code by the central control facility means, is stored in the central processing computers of the facility. This information, which is supplied by and under the control of the registered owner of the individual signal unit, may include instructions as to what actions are to be taken in response to the signal.

Although in this preferred form of the invention, the individual signal unit 22 is only enabled to transmit a single encrypted identifying code, it may do so in various ways to indicate various events. Each external event sensor is associated with a unique sequence of repeat transmissions of said unique identification code. For example if an external sensor device is activated, the code may be transmitted a predefined number of times for that particular sensor at short intervals. However should an error condition develop in the device itself, such as for example a low battery situation, the code may be transmitted singly. The manner of transmission of this single encrypted code is then the determinant of the status of the device and of what action should be taken by the central control facility.

According to its pre-programmed instructions, an individual signal unit 22 may continue to transmit its signal at intervals for a predefined period as an aid in location of the device by service personnel alerted by the central control facility 12 as described below.

Again with reference to FIGS. 9 and 10, a received signal is acted upon by the central control facility 12, notifying any of a number of nominated recipients 30 according to a pre-established protocol negotiated between the registered user of the individual signal unit 22 and the control facility. Notification of derails of a monitored event could be made in the form of an email via the Internet 29 as shown in FIGS. 9 and 10, by facsimile transmission or over the distributed network 21 to any personal communication device.

Typically, one nominated recipient 30 will be the registered user or owner of the individual signal from which the alerting signal was received. However nominated recipients may also include service providers, who are automatically notified of the occurrence and the nature of the event, the location of the individual signal unit and any other predefined details. Service providers may include police, fire and ambulance services, or equipment servicing personnel for example. At registration of an individual signal unit, the owner of the unit may elect that independent third parties be contacted only on receipt by the central control facility of authorisation from the owner.

An applicant user or owner will be required to supply all relevant details of the individual signal unit, its external event sensing faculties, intended location and the procedures to be implemented on receipt of a signal from the device. The central control facility then issues the unique identification code for the individual signal unit. Alternatively, an individual signal unit may be pre-programmed at manufacture with its unique identifying code. As well, the applicant user or owner nominates a service provider of the GSM, GPRS or other communication system, for billing purposes, or alternatively, the central control facility makes this arrangement, with billing for such service included in the overall charge for use of the system.

The information thus received is used by the central control facility to program the procedure to be followed by the facility in response to signals received from the individual signal unit. The facility may also transmit data to the individual signal unit prior to its commissioning but subsequent to its installation at the infrastructure item, to set the parameters of signal transmission, such as frequency and interval of repeat transmissions for example.

In Use

The individual signal unit (ISU 22) of preferred embodiments of the invention thus provides considerable flexibility in the management of electrical power particularly mains power derived from power outlets in a domestic or industrial context. For example the ISU 22 may afford micro management of an office environment where for example the sensing units 110 are installed at every workstation detect that only one or a small number of personnel are at work in the office. The ISU 22 can then arrange modification to power use through adjustments to lighting and air conditioning for example. Air conditioning settings moreover can be monitored and adjusted according to data provided by the ambient temperature monitoring module of the unit.

Power monitoring of individual devices is afforded by the sensing unit 110, so that for example the power usage of a television set can be profiled over time to gauge its power consumption and provide data for more efficient use of the appliance. Such data on power usage of various appliances may lead to modified use or replacement of a device in the interest of lowering power bills.

The individual signal unit 22 may detect that the temperature in a room is above or below that of a desired set temperature and take appropriate action by signalling adjustments to either air conditioners or heaters as appropriate.

A movement sensor in a sensing unit 110 may detect no movement in the vicinity of the unit for a given period of time and so switch off power where appropriate.

In one form the plug-in, pass-through power sensor 110 with wireless communications has the following capabilities:

a) 240V plug on the back, socket on the front, suitable for standard wall outlets,
b) Measures accurately down to at least 100 mA current,
c) Continuous voltage and current, power factor measurement,
d) PIR,
e) Ambient light,
f) Temperature,
g) Humidity,
h) Ability to switch the load on or off remotely and,
i) Periodic wireless reporting of senor information (limited by radio/network congestion).

The ISU Base Unit 22 may include the following capabilities:

a) Ability to wirelessly receive data from up to 25 power sensor units and forward the data to a server for processing The intelligent database functions to support the unit 110 may require:

a) Managing connection and allocation of sensors to ISUs,
b) Controlling reporting frequency,
c) Maintaining location and user identification information against each sensor and therefore each measurement,
d) Reporting individual or groups of sensor data as a web service feed (in JSON, XML or as required) for use in either external web pages or for storage in an external database,
e) Allowing control of the power switch on each sensor unit by accessing a web service URL,
f) Providing a "Google Gadget" style dashboard for each user which will allow display of current readings, historical graphs as well as push button control of the power switch. Dashboard is user configurable and operational via any web connected service (for example, PC or mobile phone,
g) Providing a facility to trigger actions based on simple expressions of sensor data values (Events). Actions include Email, IM or SMS messaging, calling a Web URL or control of the power switch on the sensor. Events and Actions are configurable per user via a web interface.

In particular forms the characteristics of the wall mounted unit in the form of a "microhub" in communication with the ISU may include the following: A micro hub to the ISU or other hubs e.g. smart metering (were power is being monitored by the smart meter we aim to provide a specialised device to compliment the utility data as well as the ISU).

Enables but not limited to the micro management of office environments e.g. rather than air conditioning an entire floor, especially when there may only be 1 of 100 staff members working, specific individual personal temperature requirements or power usage can be configured and reconfigured using the ISU or existing proprietary hardware to control the device.

Other units may provide power control and monitor but using open hardware architecture the current model is not proprietary control constrained. The hardware provides multiple senses to enable the full environment sensory capability so actual power relative to environment is achieved:

Is the TV overheating the room?
Is the wall heater clashing with the air conditioner?
What device is attached to the wall unit, profile the data? e.g. LG TV, provide data to others for the actual real-time user coats and advertising of device relative to other profiled TV i.e. this Samsung TV costs on average $300 a yr less to run. Provide data to retailer for promotional rebates etc.

No movement near wall plug turn power off, apply logic . . . track my phone. Tract a localised RF transmitter fob, etc The wall unit is price sensitive so high volume production may enable each unit to have full transmission to the ISU system over internet i.e. a micro ISU. Current versions focus on enabling the data to be transmitted to the ISU as cost effectively and as valuably as possible.

Power Usage can be Controlled at Multiple Levels of Hierarchic

Current plug-in, pass-through power sensor measures accurately down to at least 100 mA (theoretical accuracy is well down into the noise in single digits), measures voltage and current several hundred times a second, can account for and report voltage and current phase relationships (and therefore power factor), can support a PIR, light sensor and temperature sensor on board and supports modular, plug-gable radio modules, humidity.

Interacts directly with the ISU or other device e.g. smart phone, smart meter which enables data feed to our centralised CCF platform for distribution.

It enables full versatility for all environmental effects relative to power consumption monitoring and control.

Components are removable and module is expandable dependent on specific environment requirements.

The same concept is planned to enable other switches in future also and not limited to: DC-safe guarding green power feeds for example the recent floods in Brisbane had live solar feeds going straight into the Brisbane river with no way of disabling the solar circuits The control of three phase e.g. Hot water units. If there's nobody home turn off peak unit off whilst monitoring power feeds Control of Main switch boards Workshop 3 phase plant Sensors:

Continuous monitoring of power (voltage/current/phase difference).

Reporting as often as required (limited by radio/network congestion).

With ability to switch the load on or off by radio command.

With an onboard temperature sensor reporting with power measurements.

With a built in PIR detector reporting with power measurements.

With a built in light sensor reporting with power measurements.

Internal pluggable modules

The above describes only some embodiments of the present invention and modifications, obvious to those skilled in the art, can be made thereto without departing form the scope of the present invention.

The invention claimed is:

1. A method for power monitoring and control by using a system having an individual signal unit (ISU), multiple power monitoring and sensing units (PMSUs), each PMSU equipped with an a transceiving module that is pluggable into any of the multiple PMSUs, each PMSU including circuitry for monitoring power flow when coupled to a power outlet and including at least one sensor for monitoring an environmental parameter, the method comprising:

designating any one of the PMSUs to act as a master PMSU and designating multiple other of the PMSUs to each act as a slave PMSU;

transmitting power usage data wirelessly from the transceiving module of a first one of the slave PMSUs via the transceiving module of at least one other of the slave PMSUs to the master PMSU, the power usage data representing the power flow monitored by the first one of the slave PMSUs;

transmitting sensor input wirelessly from the transceiving module of a second one of the slave PMSUs via the transceiving module of at least one other of the slave PMSUs to the master PMSU, the sensor input representing the environmental parameter monitored by the second one of the slave PMSUs;

combining, by the master PMSU, the power usage data and the sensor input into combined data; and determining, by the master PMSU, a course of action to be communicated to at least one of the slave PMSUs based on the combined data;

wherein the determining step further comprises:

transmitting, by the master PMSU, the combined data to a central control facility via the individual signal unit;

returning from the central control facility to the master PMSU via the individual signal unit, in response to receiving the combined data, one or more predefined steps to be performed by the at least one slave PMSUs; and transmitting the one or more predefined steps from the master PMSU to the at least one slave PMSU via the transceiving module of at least one other of the PMSUs to cause an adjustment in power usage monitored by the at least one slave PMSU.

2. The method of claim 1, wherein said transceiving module includes short range wireless communication protocols.

3. The method of claim 1, wherein said individual signal unit is a mobile phone.

4. The method of claim 1, wherein said individual signal unit is a Wi-Fi router in communication with one or more nominated receiving entities over the Internet.

5. The method of claim 1, wherein each of said power monitoring and sensing units is provided with relay circuitry for on/off control of power flow.

6. The method of claim 5, wherein said power flow is mains power flow.

7. The method of claim 1, wherein said environmental parameter is a proximate ambient temperature.

8. The method of claim 1, wherein said environmental parameter is a proximate lighting level.

9. The method of claim 1, wherein said environmental parameter is a sensed motion.

10. The method of claim 1, wherein a communication between said individual signal unit and said central control facility is not limited by distance.

* * * * *